United States Patent [19]
Okamoto

[11] Patent Number: 6,154,100
[45] Date of Patent: Nov. 28, 2000

[54] RING OSCILLATOR AND DELAY CIRCUIT USING LOW THRESHOLD VOLTAGE TYPE MOSFETS

[75] Inventor: Toshiharu Okamoto, Tokyo, Japan

[73] Assignee: NEC Corporation, Tokyo, Japan

[21] Appl. No.: 09/386,203

[22] Filed: Aug. 30, 1999

[30] Foreign Application Priority Data

Aug. 31, 1998 [JP] Japan .................................. 10-245446

[51] Int. Cl.[7] .............................. H03B 5/02; H03H 11/26; H03K 3/354
[52] U.S. Cl. ........................ 331/57; 331/177 R; 327/281; 327/288
[58] Field of Search ................................ 331/57, 177 R; 327/281, 288

[56] References Cited

U.S. PATENT DOCUMENTS

| | | | |
|---|---|---|---|
| 4,853,654 | 8/1989 | Sakurai | 331/57 |
| 5,180,995 | 1/1993 | Hayashi et al. | 331/57 |
| 5,499,214 | 3/1996 | Mori et al. | 331/57 |
| 5,731,727 | 3/1998 | Iwamoto et al. | 331/57 |

FOREIGN PATENT DOCUMENTS

| | | |
|---|---|---|
| 4-346515 | 12/1992 | Japan . |
| 6-29834 | 2/1994 | Japan . |
| 7-130174 | 5/1995 | Japan . |
| 8-228145 | 9/1996 | Japan . |
| 9-307420 | 11/1997 | Japan . |

*Primary Examiner*—Siegfried H. Grimm
*Attorney, Agent, or Firm*—Sughrue, Mion, Zinn, Macpeak & Seas, PLLC

[57] ABSTRACT

Of the MOSFETs used to implement an oscillator circuit or a delay circuit in a semiconductor device, minimally the MOSFETs P12 (N12) used in a part of the circuit that affects the oscillation period or delay time are low-threshold-voltage type MOSFETs.

12 Claims, 8 Drawing Sheets

VCC DEPENDENCY OF OSCILLATION PERIOD ACCORDING TO THE PRESENT INVENTION

INVERTER CIRCUIT DC CHARACTERISTICS

Fig. 8

DC ANALYSIS OF AN INVERTER CIRCUIT

Fig. 9

DC ANALYSIS OF AN INVERTER WITH A LOW VCC

Fig. 10

CIRCUIT OPERATING POWER SUPPLY VOLTAGE RANGE

RING OSCILLATOR AND DELAY CIRCUIT USING LOW THRESHOLD VOLTAGE TYPE MOSFETS

BACKGROUND OF THE INVENTION

1. Field of the Invention

The present invention relates to a semiconductor integrated circuit that includes a low-threshold-voltage MOSFET, and more particularly to a ring oscillator and a delay circuit.

2. Description of the Related Art

First, the DC operation of an inverter circuit will be described, with reference to FIG. 6 through FIG. 10.

For the purpose of this description, the power supply voltage (referred to as VCC hereinafter) will be made 3 V, and the threshold value of the MOSFET will be taken as the typical values in the past, this being a threshold value of 0.7 V at room temperature for an NMOS device (this threshold being hereinafter referred to as VTN) and a threshold value of −0.7 V at room temperature for an PMOS device (this threshold being hereinafter referred to as VTP).

First, let us consider the case in which the input voltage is VCC−|VTP| or greater. In this case, for a PMOS device, because the potential difference between the gate and the source is less than |VTP|, the PMOS device is non-conducting, and for an NMOS device, because the potential difference between the gate and the source is greater than |VTN|, the NMOS device conducts. Therefore, the output voltage is at the ground level.

Next, consider the case in which the input voltage is VCC−|VTP|−|α|. For a PMOS device, because the difference in potential between the gate and source is larger than |VTP| by the amount of α, the PMOS device conducts, and for an NMOS device, because the potential difference between the gate and source is greater than |VTN|, the NMOS device conducts. Note, however, because of (gm of the PMOS device)<<(gm of the NMOS device), the output voltage is near the ground level.

Next, consider the case in which the input voltage is GND+|VTN|+|α|. For a PMOS device, because the difference in potential between the gate and the source is greater than |VTP|, the PMOS device conducts. For an NMOS device, because the difference in potential between the gate and source is greater than |VTN| by the amount α, the NMOS device conducts. Note, however, because of (gm of the PMOS device)>>(gm of the NMOS device), the output voltage is near VCC.

Next, consider the case in which the input voltage is GND+|VTN|. In this case, for a PMOS device, because the difference in potential between the gate and source is greater than |VTP|, the PMOS device conducts. For an NMOS device, because the difference in potential between the gate and source is lower than |VTN|, the NMOS device is non-conducting. The output voltage, therefore, is VCC.

The foregoing description of the operation of an inverter assumes that the power supply voltage VCC is 3 V.

As is clear from the above-noted description of the operation of an inverter, to operate an inverter it is necessary that VCC be higher than |VTN|+|VTP|+|α|. For example, using the numerical example given above, this would be |1.4| V+α.

Figure 9:
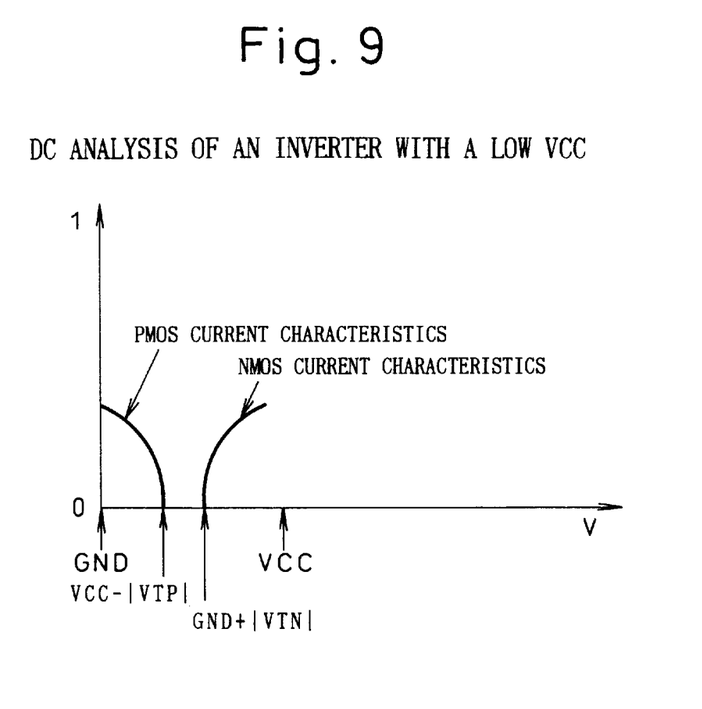
FIG. 9 is a graph that illustrates the condition in which the power supply voltage of an inverter according to the prior art is low.
Figure 10:
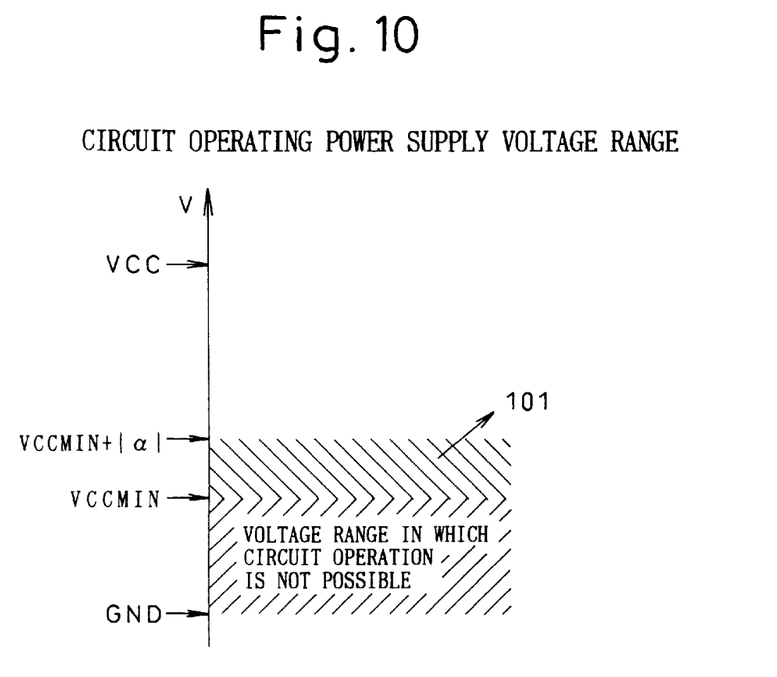
FIG. 10 is a graph that illustrates the range of operating power supply voltage of the circuit.

Next, consider the case in which the power supply voltage is made low. FIG. 9 is a drawing that illustrates the operation at a VCC that is below the lower operating limit.

If the device is designed so that the MOSFET threshold voltage is a value that is lower than that described above, the VCC operating margin is broadened. However, there is the problem of a worsening of the current consumption characteristics when the semiconductor device is in the standby condition.

While the foregoing description was with regard to an inverter circuit, the characteristics of other logic gate circuits, such as NAND circuits and NOR circuits are approximately the same as an inverter circuit.

Figure 11:
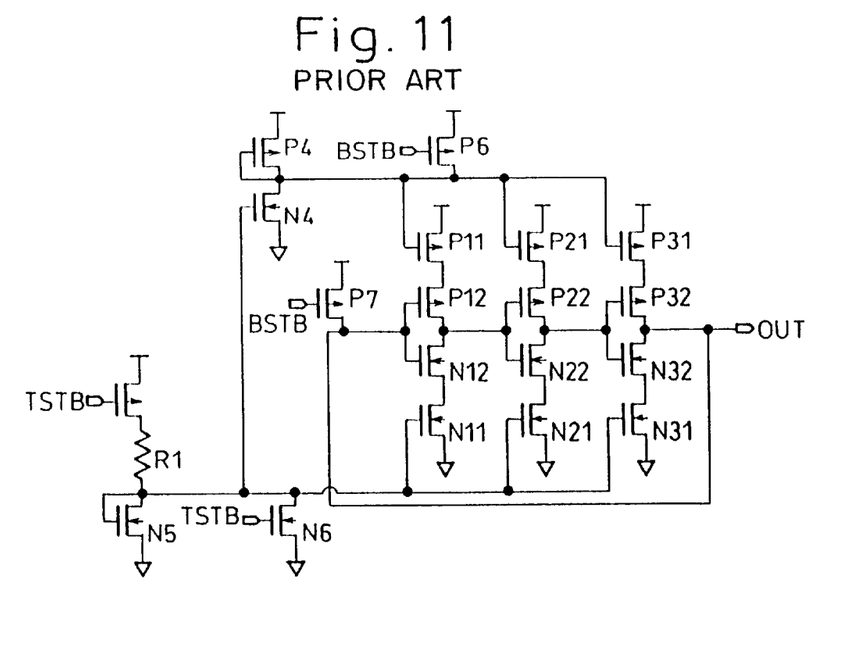
FIG. 11 is a circuit diagram of a ring oscillator according to the prior art.
Figure 12:
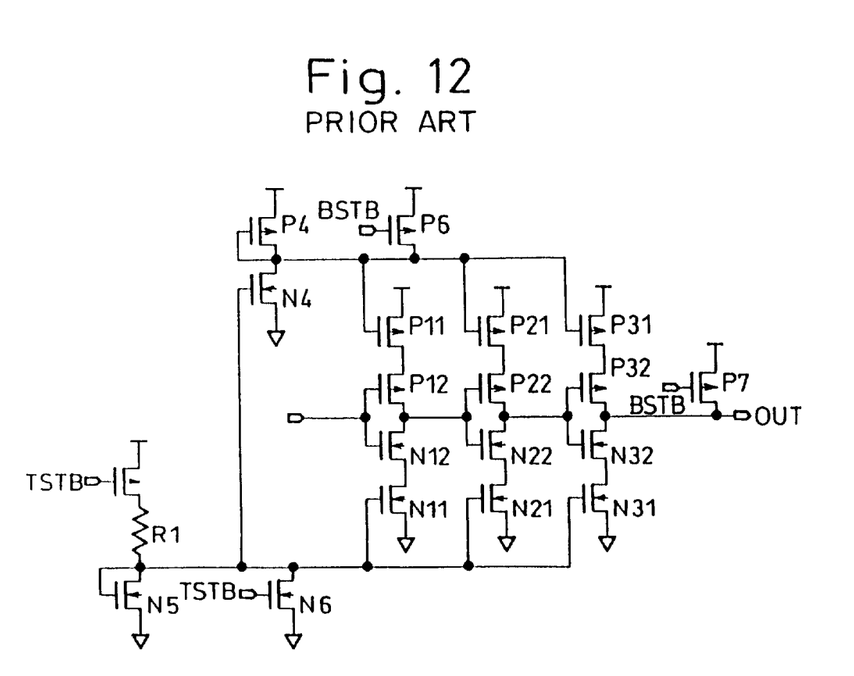
FIG. 12 is a circuit diagram of a delay circuit according to the prior art.

An oscillator circuit or delay circuit is used to provide a signal having an appropriate arbitrary time delay for another circuit within the semiconductor device. FIG. 11 shows an oscillator circuit of the past, and FIG. 12 shows a delay circuit of the past.

Next, the configuration and operation of the oscillator circuit of FIG. 11 will be described.

The NMOS transistors N5, N4, N11, N21 and N31 form a current mirror cicuit, and the PMOS transistors P4, P11, P21, and P31 form another current mirror cicuit. An inverter ring is formed by the transistors P11, P12, N12, N11, P21, P22, N22, N21, P31, P32, N32, and N31, as shown in FIG. 11.

The transistors P11, P21, P31, N11, N21, and N31, and the transistors P4 and N5 act as constant-current elements when operating, and act as current-blocking elements when in the standby condition. The activating signals of this circuit are TSTB and the compliment thereto, BSTB, and the output terminal of the circuit is OUT.

Figure 13:
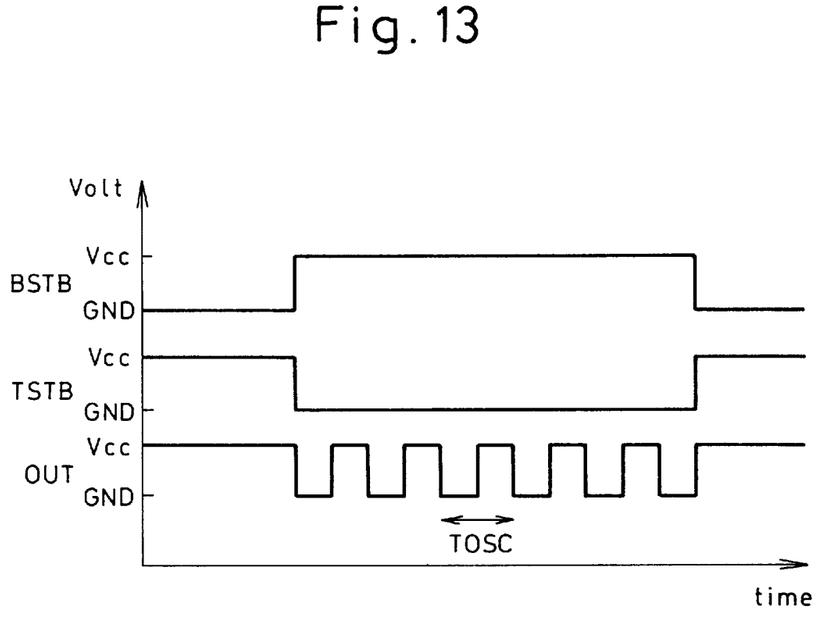
FIG. 13 is a timing diagram of a ring oscillator according to the prior art.

When operation of the circuit starts, a high level and a low level are applied to the activating signals TSTB and BSTB, respectively. A constant current is generated by the resistance R1 and the transistor N5 and, by means of a current mirror connection, this is reflected in the inverter ring. The inverter ring operates so as to oscillate within an operating current range that is limited by the above-described constant-current circuit. FIG. 13 shows the timing of this circuit, and FIG. 14 shows the dependence of the oscillation period TOSC on VCC.

The dependency on VCC of the oscillation period TOSC of the inverter ring that is controlled by the constant current is such that the oscillation period TOSC increases with an increase in VCC and decreases with a decrease in VCC.

Figure 14:
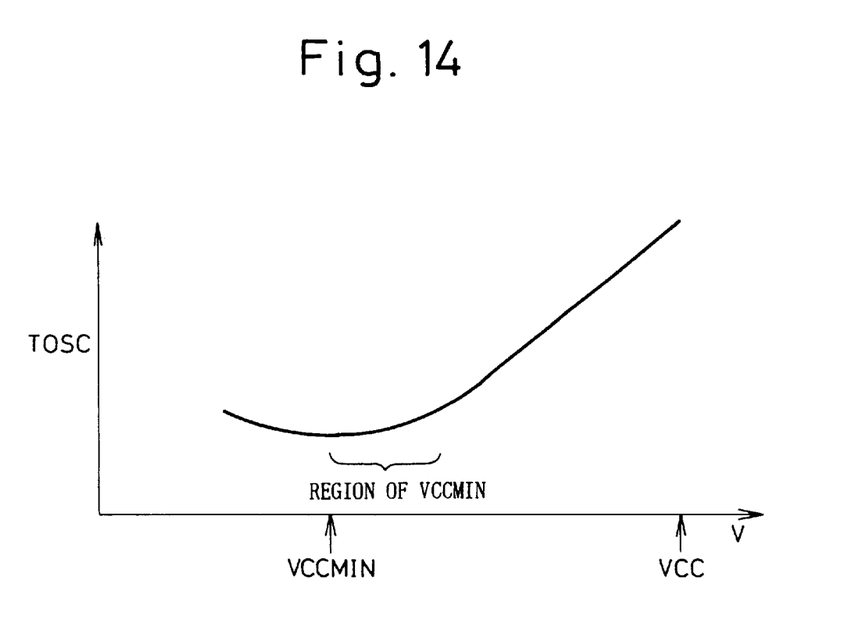
FIG. 14 is a graph that shows the power supply voltage dependency of the oscillation period of a ring oscillator according to the prior art.

Although the VCC dependency of the oscillation period TOSC is substantially linear, it is offset from the straight line in the region of VCCMIN, exhibiting a characteristic that approaches a fixed value as shown in FIG. 14.

Next, the delay circuit of FIG. 12 will be described.

This circuit is approximately the same as the oscillator circuit of FIG. 11. When operation starts, a low level and a high level are applied to the activation signals TSTB and BSTB, respectively. A constant current is generated by the resistance R1 and the transistor N5 and, by means of a current mirror connection, this is reflected in the inverter chain. The inverter chain operates so as to perform switching operation within an operating current range that is limited by the above-described constant-current circuit.

Figure 15:
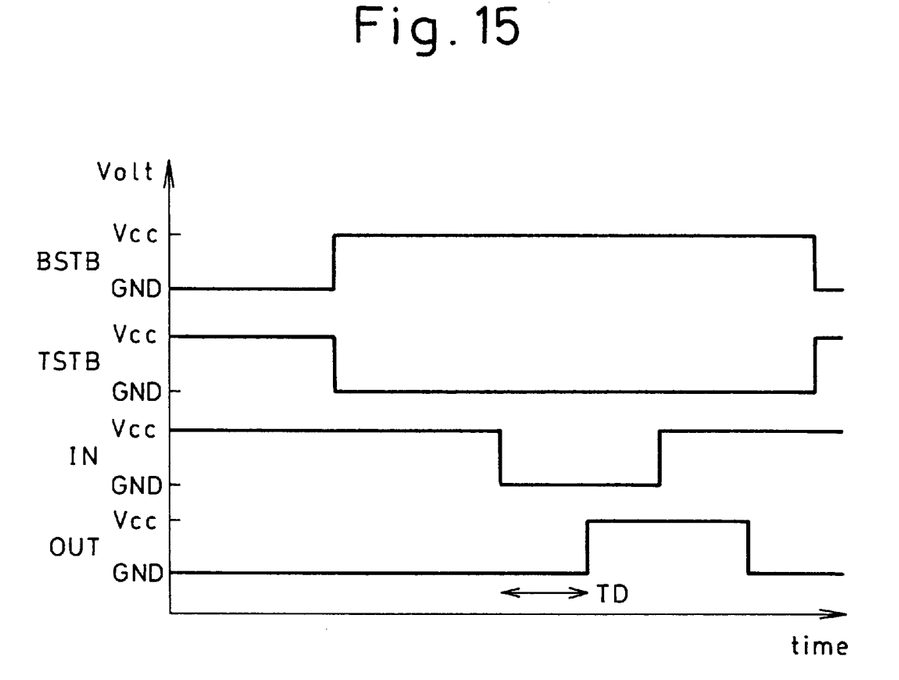
FIG. 15 is a timing diagram of a delay circuit according to the prior art.
Figure 16:
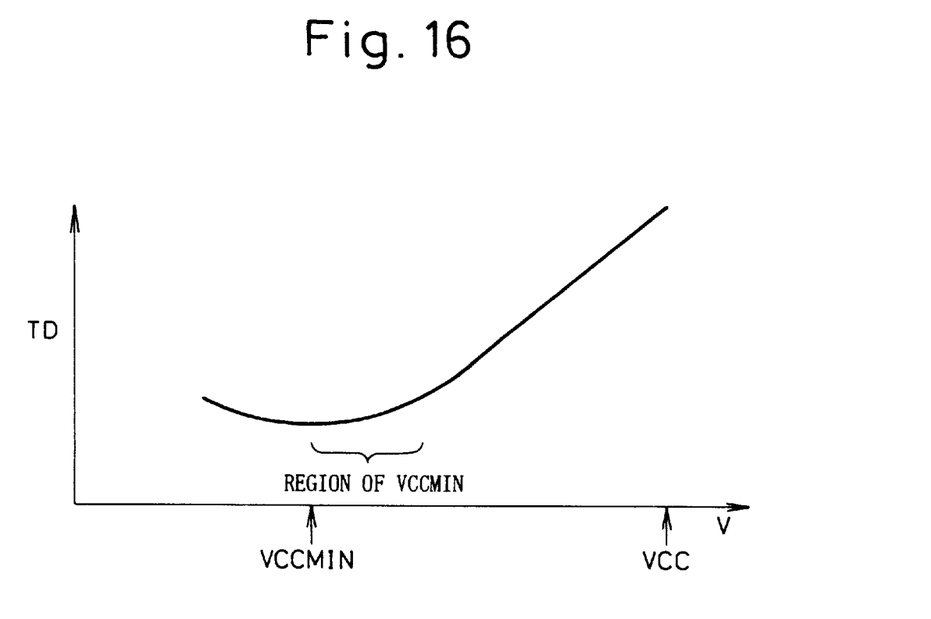
FIG. 16 is a graph that shows the power supply voltage dependency of the delay time of a delay circuit according to the prior art.

FIG. 15 is the timing diagram of the above-noted circuit, and FIG. 16 shows the dependency on VCC of the delay time TD of this circuit.

The VCC dependency of the delay time of the inverter chain that is controlled by a constant current is such that the delay time increases with an increase in VCC and decreases with a decrease of VCC. Although the VCC dependency of the delay time TD is substantially linear, it is offset from the straight line in the region of VCCMIN, exhibiting a characteristic that approaches a fixed value as shown in FIG. 16.

A problem that is associated with an oscillator circuit and delay circuit that have the above-described VCC dependency is the loss of circuit characteristics linearity. The oscillator circuit or delay circuit is used to provide a signal having an appropriate arbitrary time delay for another circuit within the semiconductor device. However, as noted above, at a VCC that is in the region of VCCMIN, it becomes impossible to provide a signal having an appropriate timing to another circuit, and because of this there is a rapid worsening of the overall semiconductor device characteristics at a VCC value in the region of VCCMIN.

The Japanese Unexamined Patent Publication (KOKAI) No. 4-346515 discloses BICMOS NAND circuit having low-threshold-voltage type MOSFETs, so as to reduce power consumption. However, this circuit is different from the present invention in terms of problem to be solved and constitution.

SUMMARY OF THE INVENTION

Accordingly, it is an object of the present invention to improve on the above-noted drawbacks in the prior art, by providing a novel ring oscillator and delay circuit, which in particular do not exhibit a low of characteristics and performance when the drive power supply voltage of the semiconductor device is low.

In order to achieve the above-noted objects, the present invention adopts the following basic technical constitution.

Specifically, the first aspect of a ring oscillator according to the present invention is a ring oscillator made up of a plurality of inverters, each being implemented by a first p-channel MOSFET and a first n-channel MOSFET, which are connected to each other forming a ring like configuration, in each one of said inverters, a second p-channel MOSFET which serving as a constant current load of said first p-channel MOSFET is provided between a voltage source and a source of said first p-channel MOSFET, while a second n-channel MOSFET which serving as a constant current load of said first n-channel MOSFET is provided between a source of said first n-channel MOSFET and ground, wherein said first n-channel MOSFET is a low-threshold-voltage type MOSFET, and a level of a threshold voltage of said first n-channel MOSFET is set at a level lower than that of said second n-channel MOSFET.

The second aspect of a ring oscillator of the present invention is a ring oscillator made up of a plurality of inverters, each being implemented by a first p-channel MOSFET and a first n-channel MOSFET, which are connected to each other forming a ring like configuration, in each one of said inverters, a second p-channel MOSFET which serving as a constant current load of said first p-channel MOSFET is provided between a voltage source and a source of said first p-channel MOSFET, while a second n-channel MOSFET which serving as a constant current load of said first n-channel MOSFET is provided between a source of said first n-channel MOSFET and ground, wherein said first p-channel MOSFET is a low-threshold-voltage type MOSFET, and a level of a threshold voltage of said first p-channel MOSFET is set at a level lower than that of said second p-channel MOSFET.

The third aspect of a ring oscillator of the present invention is a ring oscillator made up of a plurality of inverters, each being implemented by a first p-channel MOSFET and a first n-channel MOSFET, which are connected to each other forming a ring like configuration, in each one of said inverters, a second p-channel MOSFET which serving as a constant current load of said first p-channel MOSFET is provided between a voltage source and a source of said first p-channel MOSFET, while a second n-channel MOSFET which serving as a constant current load of said first n-channel MOSFET is provided between a source of said first n-channel MOSFET and ground, wherein said first n-channel MOSFET and said second n-channel MOSFET are both low-threshold-voltage type MOSFET, and a level of a threshold voltage of said second n-channel MOSFET is set at approximately the same level as that of said first n-channel MOSFET.

The fourth aspect of a ring oscillator of the present invention is a ring oscillator made up of a plurality of inverters, each being implemented by a first p-channel MOSFET and a first n-channel MOSFET, which are connected to each other forming a ring like configuration, in each one of said inverters, a second p-channel MOSFET which serving as a constant current load of said first p-channel MOSFET is provided between a voltage source and a source of said first p-channel MOSFET, while a second n-channel MOSFET which serving as a constant current load of said first n-channel MOSFET is provided between a source of said first n-channel MOSFET and ground, wherein said first p-channel MOSFET and said second p-channel MOSFET are both low-threshold-voltage type MOSFET, and a level of a threshold voltage of said second p-channel MOSFET is set at approximately the same level as that of said first p-channel MOSFET.

The fifth aspect of a ring oscillator of the present invention is a ring oscillator made up of a plurality of inverters, each being implemented by a first p-channel MOSFET, a second p-channel MOSFET, a second n-channel MOSFET and a first n-channel MOSFET, each being serially connected to each other in this order from a higher voltage source to a lower voltage source, said second p-channel MOSFET and said second n-channel MOSFET being driven with a constant current so as to serve as a constant current load of said first p-channel MOSFET and said first n-channel MOSFET, respectively, a gate of said first p-channel MOSFET and a gate of said first n-channel MOSFET being connected to each other to form said inverter, said inverters being connected to each other forming a ring like configuration, wherein said first n-channel MOSFET is a low-threshold-voltage type MOSFET, and a level of a threshold voltage of said first n-channel MOSFET is set at a level lower than that of said second n-channel MOSFET.

The sixth aspect of a ring oscillator of the present invention is a ring oscillator made up of a plurality of inverters, each being implemented by a first p-channel MOSFET, a second p-channel MOSFET, a second n-channel MOSFET and a first n-channel MOSFET, each being serially connected to each other in this order from a higher voltage source to a lower voltage source, said second p-channel MOSFET and said second n-channel MOSFET being driven with a constant current so as to serve as a constant current load of said first p-channel MOSFET and said first n-channel MOSFET, respectively, a gate of said first p-channel MOSFET and a gate of said first n-channel MOSFET being connected to each other to form said inverter, said inverters being connected to each other forming a ring like configuration, wherein said first p-channel MOSFET is a low-threshold-voltage type MOSFET, and a level of a threshold voltage of said first p-channel MOSFET is set at a level lower than that of said second p-channel MOSFET.

The first aspect of a delay circuit according to the present invention is a delay circuit made up of a plurality of inverters, each being implemented by a first p-channel MOSFET and a first n-channel MOSFET, which are serially connected to each other, in each one of said inverters, a second p-channel MOSFET which serving as a constant current load of said first p-channel MOSFET is provided between an voltage source and a source of said first p-channel MOSFET, while a second n-channel MOSFET which serving as a constant current load of said first n-channel MOSFET is provided between a source of said first n-channel MOSFET and ground, wherein said first n-channel MOSFET is a low-threshold-voltage type MOSFET, and a level of a threshold voltage of said first n-channel MOSFET is set at a level lower than that of said second n-channel MOSFET.

The second aspect of the present invention is a delay circuit made up of a plurality of inverters, each being implemented by a first p-channel MOSFET and a first n-channel MOSFET, which are serially connected to each other, in each one of said inverters, a second p-channel MOSFET which serving as a constant current load of said first p-channel MOSFET is provided between an voltage source and a source of said first p-channel MOSFET, while a second n-channel MOSFET which serving as a constant current load of said first n-channel MOSFET is provided between a source of said first n-channel MOSFET and ground, wherein said first p-channel MOSFET is a low-threshold-voltage type MOSFET, and a level of a threshold voltage of said first p-channel MOSFET is set at a level lower than that of said second p-channel MOSFET.

The third aspect of the present invention is a delay circuit made up of a plurality of inverters, each being implemented by a first p-channel MOSFET and a first n-channel MOSFET, which are serially connected to each other, in each one of said inverters, a second p-channel MOSFET which serving as a constant current load of said first p-channel MOSFET is provided between an voltage source and a source of said first p-channel MOSFET, while a second n-channel MOSFET which serving as a constant current load of said first n-channel MOSFET is provided between a source of said first n-channel MOSFET and ground, wherein said first n-channel MOSFET and said second n-channel MOSFET are both low-threshold-voltage type MOSFET, and a level of a threshold voltage of said second n-channel MOSFET is set at approximately the same level as that of said first n-channel MOSFET.

The fourth aspect of the present invention is a delay circuit made up of a plurality of inverters, each being implemented by a first p-channel MOSFET and a first n-channel MOSFET, which are serially connected to each other, in each one of said inverters, a second p-channel MOSFET which serving as a constant current load of said first p-channel MOSFET is provided between a voltage source and a source of said first p-channel MOSFET, while a second n-channel MOSFET which serving as a constant current load of said first n-channel MOSFET is provided between a source of said first n-channel MOSFET and ground, wherein said first p-channel MOSFET and said second p-channel MOSFET are both low-threshold-voltage type MOSFET, and a level of a threshold voltage of said second p-channel MOSFET is set at approximately the same level as that of said first p-channel MOSFET.

The fifth aspect of the present invention is a delay circuit made up of a plurality of inverters, each being implemented by a first p-channel MOSFET, a second p-channel MOSFET, a second n-channel MOSFET and a first n-channel MOSFET, each being serially connected to each other in this order from a higher voltage source to a lower voltage source, said second p-channel MOSFET and said second n-channel MOSFET being driven with a constant current so as to serve as a constant current load of said first p-channel MOSFET and said first n-channel MOSFET, respectively, a gate of said first p-channel MOSFET and a gate of said first n-channel MOSFET being connected to each other to form said inverter, said inverters being serially connected to each other, wherein said first n-channel MOSFET is a low-threshold-voltage type MOSFET, and a level of a threshold voltage of said first n-channel MOSFET is set at a level lower than that of said second n-channel MOSFET.

The sixth aspect of the present invention is a delay circuit made up of a plurality of inverters, each being implemented by a first p-channel MOSFET, a second p-channel MOSFET, a second n-channel MOSFET and a first n-channel MOSFET, each being serially connected to each other in this order from a higher voltage source to a lower voltage source, said second p-channel MOSFET and said second n-channel MOSFET being driven with a constant current so as to serve as a constant current load of said first p-channel MOSFET and said first n-channel MOSFET, respectively, a gate of said first p-channel MOSFET and a gate of said first n-channel MOSFET being connected to each other to form said inverter, said inverters being serially connected to each other, wherein said first p-channel MOSFET is a low-threshold-voltage type MOSFET, and a level of a threshold voltage of said first p-channel MOSFET is set at a level lower than that of said second p-channel MOSFET.

Of the MOSFETs that form an oscillator circuit or a delay circuit according to the present invention, the part of the circuit that influences the oscillation period or delay time, respectively, includes an FET that is a low-threshold-voltage type of MOSFET.

Figure 2:
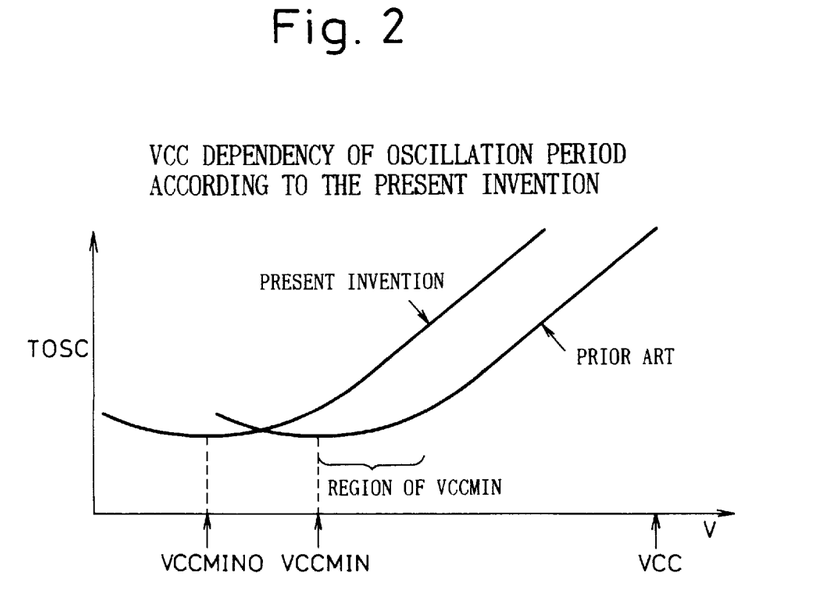
FIG. 2 is graph that shows the power supply voltage dependency of the oscillation period of the circuit of FIG. 1.

By adopting the above-noted configuration, even at a power supply voltage VCC that is in the region of VCCMIN in FIG. 2, the characteristics of a circuit that is used to provide a signal having an arbitrary timing for other circuitry within the semiconductor device can maintain a linear dependency on VCC, enabling the generation of a signal having an arbitrary timing for other circuitry within the semiconductor device.

DESCRIPTION OF THE PREFERRED EMBODIMENTS

Embodiments of a ring oscillator and a delay circuit according to the present invention are described below in detail, with references being made to relevant accompanying drawings.

Figure 1:
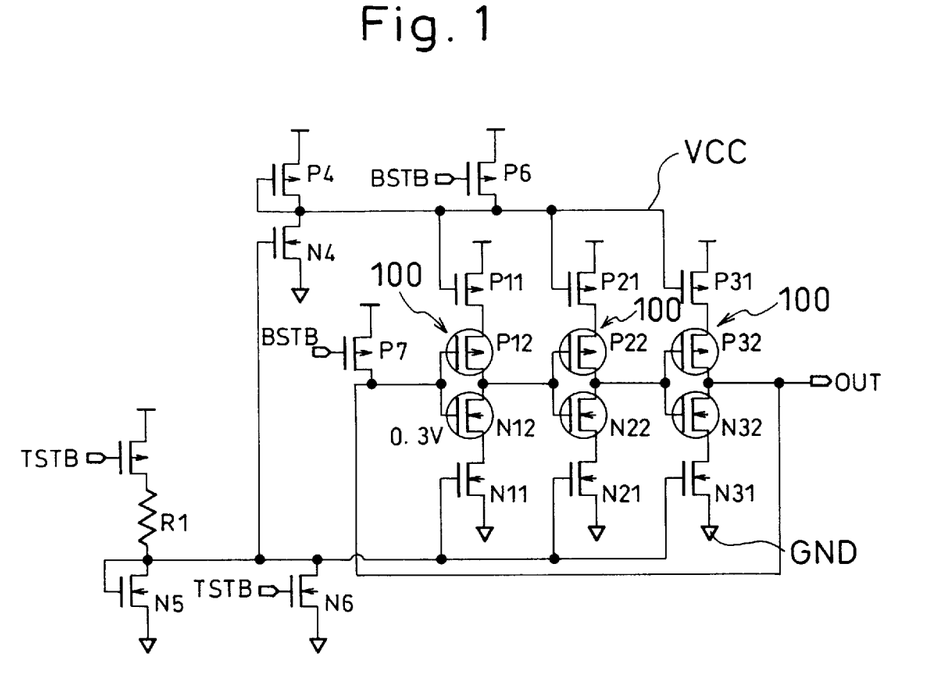
FIG. 1 is a circuit diagram of a ring oscillator according to the present invention.
Figure 5:
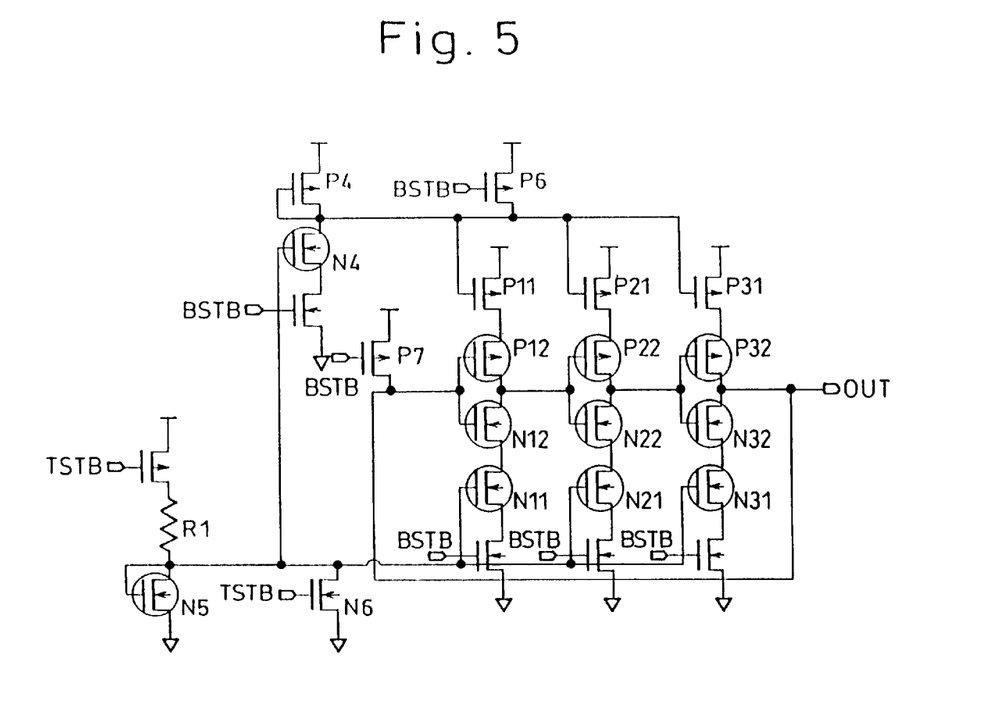
FIG. 5 is a circuit diagram of a variation of the ring oscillator according to the present invention.
Figure 6:
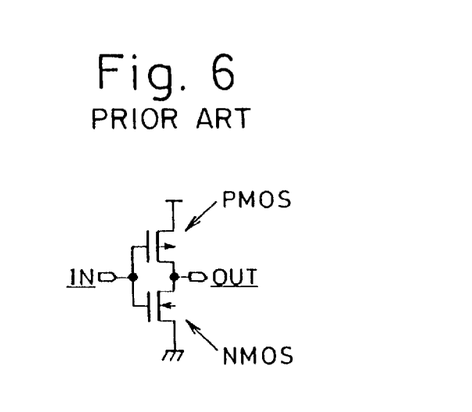
FIG. 6 is a circuit diagram of an inverter circuit according to the prior art.
Figure 7:
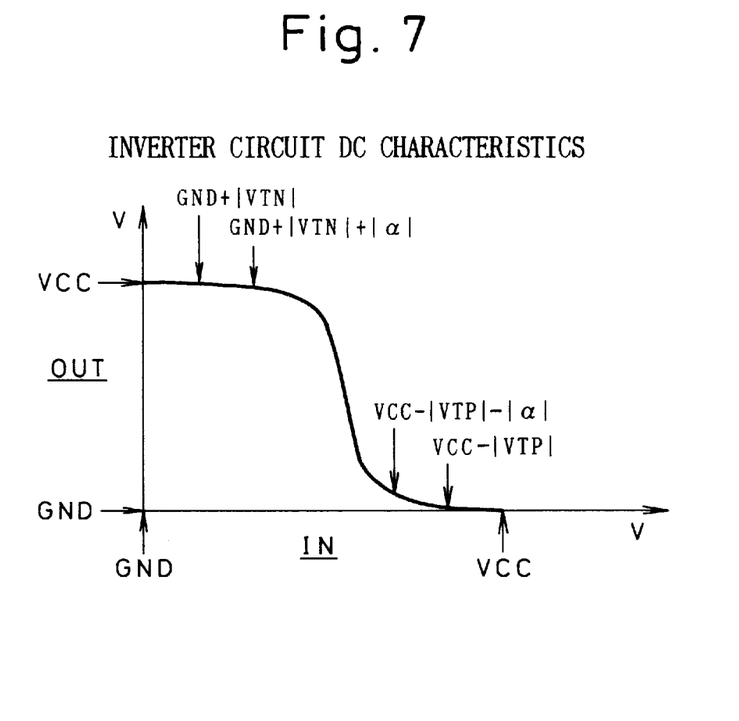
FIG. 7 is a graph that shows the DC characteristics of the inverter circuit of FIG. 6.
Figure 8:
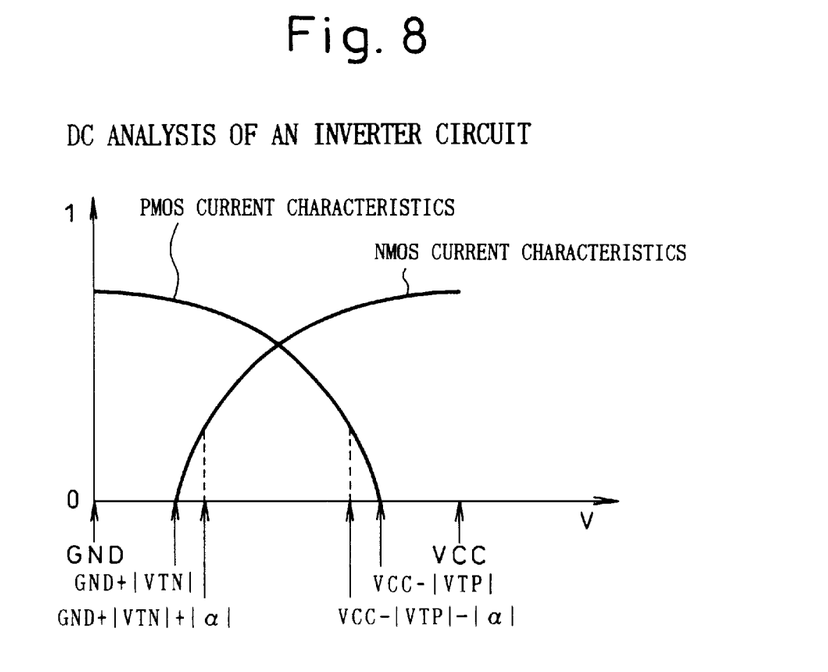
FIG. 8 is a graph that shows the DC characteristics of the inverter circuit of FIG. 6.

FIG. 1 and FIG. 5 show an embodiment of a ring oscillator according to the present invention. These drawings show a ring oscillator that is formed by inverters implemented by the p-channel FETs P12, P22, and P32 and the n-channel FETs N12, N22, and N32, the p-channel FETs P12, P22, and P32 and the n-channel FETs N12, N22, and N32 being low-threshold-voltage type MOSFETs.

In addition, a first FET N5 and second FETs N11, N21, and N31 are provided, the first FET N5 and the second FETs N11, N21, and N31 forming a current mirror circuit, the second FETs N11, N21, and N31 being constant-current loads of the inverter, and the first FET N5 and second FETs N11, N21, and N31 being low-threshold-voltage type MOSFETs.

The present invention is described in further detail below.

The circuit configuration of the ring oscillator that is shown in FIG. 1 is the same as that of FIG. 11, and will therefore not be described.

It should be noted, however, that of the transistors that form the inverter ring in a ring oscillator of the present invention, the transistors P12, N12, P22, N22, P32, and N32 are low-threshold-voltage type MOSFETs, which have a threshold voltage that is lower than that of the MOSFETs used in the other part of the circuit, these being indicated in the drawing by circles placed around the transistor symbols, to distinguish them.

Although in the above-noted embodiment, both the PMOS transistors and the NMOS transistors are low-threshold-voltage MOSFETs, it is of course possible to have only one transistor type, PMOS or NMOS, be a low-threshold-voltage type MOSFET.

In a ring oscillator configured as noted above, with the threshold value of the low-threshold-voltage MOSFET set to 0.3 V for NMOS transistors (hereinafter referred to as VTN0) and to –0.3 V for PMOS transistors (hereinafter referred to as VTP0), for example, as is clear from the foregoing description of the DC operation of the inverter circuit, the operating lower voltage limit (hereinafter referred to as VCCMIN0) is given by the following equation.

$VCCMIN0 = |VTN0| + |VTP0| + |\alpha|$ or greater $= |0.6| V + |a|$ or greater

The power supply voltage VCC dependency of the oscillation period TOSC of the inverter ring that is controlled by a constant voltage is such that the oscillation period TOSC increases with an increase in VCC and decreases with a decrease in VCC. FIG. 2 shows characteristics that exhibit this effect.

While the power supply voltage VCC dependency of the oscillation period TOSC is substantially linear, it is offset from the straight line in the region of VCCMIN0, exhibiting a characteristic that approaches a fixed value in the prior art. In the region of VCCMIN, however, the dependency of the oscillation period TOSC on the power supply voltage VCC maintains its linearity.

Therefore, according to the present invention, even in the region of VCCMIN, it is possible to provide a signal having an arbitrary appropriate timing for other parts of the circuit. Thus, even with a power supply voltage VCC in the region of VCCMIN, a signal having an arbitrary appropriate timing is supplied, so that there is no overall deterioration of the characteristics of the semiconductor device.

Figure 4:
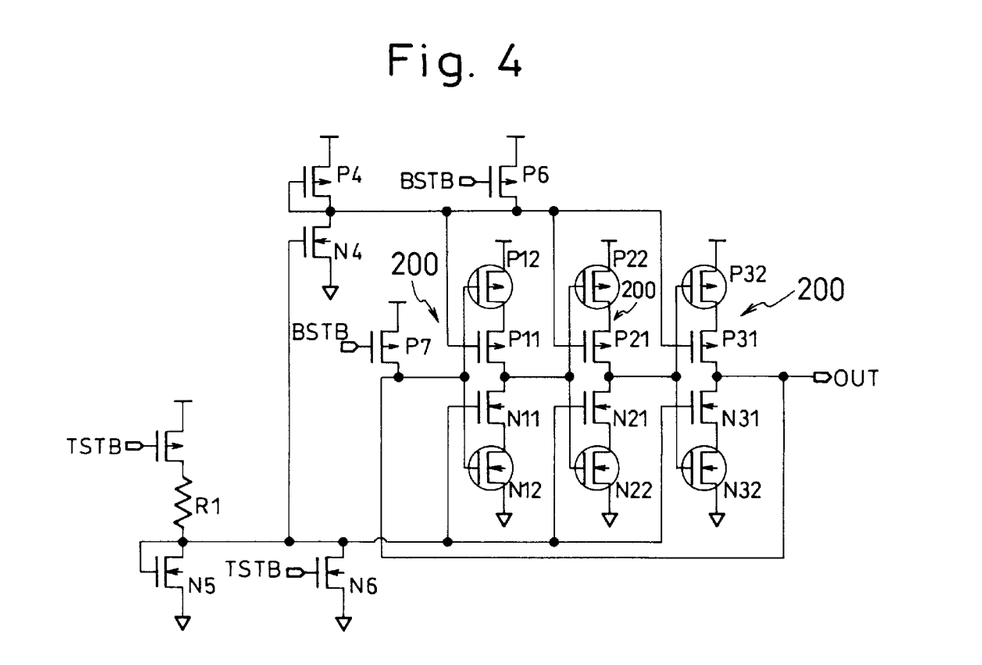
FIG. 4 is a circuit diagram of a variation of the ring oscillator according to the present invention.

FIG. 4 shows a variation of the present invention. The circuit configuration and operation are similar to those of the circuit of FIG. 1. In this example, the positions of the switching transistors and constant-current load transistors are reversed.

FIG. 5 also shows a variation of the present invention.

In this circuit, low-threshold-voltage MOSFETs are used as well in the constant-current circuit forming a current mirror circuit.

As described above, a ring oscillator shown in FIG. 1 is a ring oscillator made up of a plurality of inverters 100, 100, 100, each being implemented by a first p-channel MOSFET P12 and a first n-channel MOSFET N12, which are connected to each other forming a ring like configuration, in each one of said inverters 100, a second p-channel MOSFET P11 which serving as a constant current load of said first p-channel MOSFET P12 is provided between an voltage source VCC and a source of said first p-channel MOSFET P12, while a second n-channel MOSFET N11 which serving as a constant current load of said first n-channel MOSFET N12 is provided between a source of said first n-channel MOSFET N12 and ground GND, wherein said first n-channel MOSFET N12 is a low-threshold-voltage type MOSFET, and a level of a threshold voltage of said first n-channel MOSFET N12 is set at a level lower than that of said second n-channel MOSFET N11. And said first p-channel MOSFET P12 is a low-threshold-voltage type MOSFET, and a level of a threshold voltage of said first p-channel MOSFET P12 is set at a level lower than that of said second p-channel MOSFET P11.

In a ring oscillator shown in FIG. 5, said first n-channel MOSFET N12 and said second n-channel MOSFET N11 are both low-threshold-voltage type MOSFET, and a level of a threshold voltage of said second n-channel MOSFET N11 is set at approximately the same level as that of said first n-channel MOSFET N12.

A ring oscillator shown in FIG. 4 is a ring oscillator made up of a plurality of inverters 200, 200, 200, each being implemented by a first p-channel MOSFET P12, a second p-channel MOSFET P11, a second n-channel MOSFET N11 and a first n-channel MOSFET N12, each being serially connected to each other in this order from a higher voltage source VCC to a lower voltage source GND, said second p-channel MOSFET P11 and said second n-channel MOSFET N11 being driven with a constant current so as to serve as a constant current load of said first p-channel MOSFET P12 and said first n-channel MOSFET N12, respectively, a gate of said first p-channel MOSFET P12 and a gate of said first n-channel MOSFET N12 being connected to each other to form said inverter 200, said inverters 200 being connected to each other forming a ring like configuration, wherein said first n-channel MOSFET N12 is a low-threshold-voltage type MOSFET, and a level of a threshold voltage of said first n-channel MOSFET N12 is set at a level lower than that of said second n-channel MOSFET N11. And said first p-channel MOSFET P12 is a low-threshold-voltage type MOSFET, and a level of a threshold voltage of said first p-channel MOSFET P12 is set at a level lower than that of said second p-channel MOSFET P11.

Figure 3:
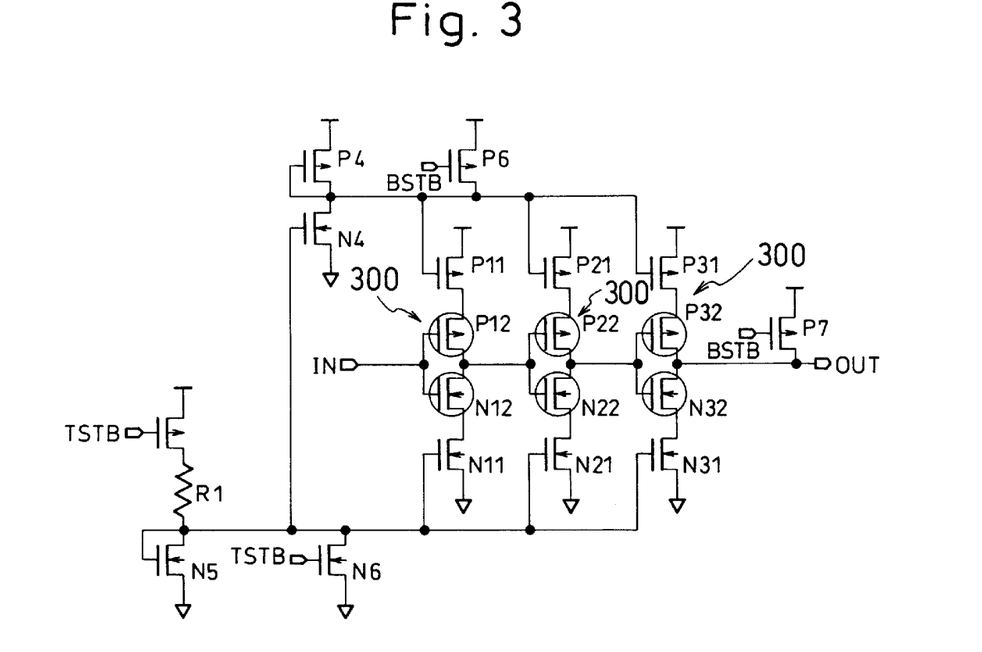
FIG. 3 is a circuit diagram of a delay circuit according to the present invention.

FIG. 3 shows another embodiment of the present invention, in the form of a delay circuit. This drawing shows a delay circuit that is formed by inverters implemented by p-channel FETs P12, P22, and P32 and n-channel FETs N12, N22, and N32. In this circuit, p-channel FETs P12, P22, and P32 and n-channel FETs N12, N22, and N32 are low-threshold-voltage type MOSFETs.

The circuit configuration is the same as that of FIG. 12, and will therefore not be described in detail.

Note, however, that of the transistors that form the inverter chain, the threshold voltages of the transistors P12, N12, P22, N22, P32, and N32 is made a lower voltage value than the threshold voltage of the MOSFETs used in the other part of the circuit, these low-threshold-voltage MOSFETs being indicated in the drawing by circles placed around the transistor symbols, to distinguish them.

While in the above-noted embodiment, both the PMOS transistors and the NMOS transistors are low-threshold-voltage MOSFETs, it is of course possible to have either just the PMOS transistors or just the NMOS transistors be low-threshold-voltage type MOSFETs.

For example, the VCCMIN' for the case of making only the NMOS transistor low-threshold-voltage MOSFETs is given by the following equation.

$$VCCMIN0'=|VTN0|+|VTP0|+|\alpha| \text{ or greater}=|1.0| \text{ V}+|\alpha| \text{ or greater}$$

Of course, it is possible to configure a delay circuit, as shown in FIG. 4 and FIG. 5.

As described above, a delay circuit of the present invention shown in FIG. 3 is a delay circuit made up of a plurality of inverters 300, 300, 300, each being implemented by a first p-channel MOSFET P12 and a first n-channel MOSFET N12, which are serially connected to each other, in each one of said inverters 300, a second p-channel MOSFET P11 which serving as a constant current load of said first p-channel MOSFET P12 is provided between a voltage source VCC and a source of said first p-channel MOSFET P12, while a second n-channel MOSFET N11 which serving as a constant current load of said first n-channel MOSFET N12 is provided between a source of said first n-channel MOSFET N12 and ground GND, wherein said first n-channel MOSFET N12 is a low-threshold-voltage type MOSFET, and a level of a threshold voltage of said first n-channel MOSFET N12 is set at a level lower than that of said second n-channel MOSFET N11. And said first p-channel MOSFET P12 is a low-threshold-voltage type MOSFET, and a level of a threshold voltage of said first p-channel MOSFET P12 is set at a level lower than that of said second p-channel MOSFET P11.

Another aspect of a delay circuit of the present invention is a delay circuit made up of a plurality of inverters, each being implemented by a first p-channel MOSFET, a second p-channel MOSFET, a second n-channel MOSFET and a first n-channel MOSFET, each being serially connected to each other in this order from a higher voltage source to a lower voltage source, said second p-channel MOSFET and said second n-channel MOSFET being driven with a constant current so as to serve as a constant current load of said first p-channel MOSFET and said first n-channel MOSFET, respectively, a gate of said first p-channel MOSFET and a gate of said first n-channel MOSFET being connected to each other to form said inverter, said inverters being serially connected to each other, wherein said first p-channel MOSFET is a low-threshold-voltage type MOSFET, and a level of a threshold voltage of said first p-channel MOSFET is set at a level lower than that of said second p-channel MOSFET.

Another aspect of a delay circuit of the present invention is that said first n-channel MOSFET is a low-threshold-voltage type MOSFET, and a level of a threshold voltage of said first n-channel MOSFET is set at a level lower than that of said second n-channel MOSFET.

Another aspect of a delay circuit of the present invention is that said first p-channel MOSFET is a low-threshold-voltage type MOSFET.

Another aspect of a delay circuit of the present invention is that said first n-channel MOSFET and said second n-channel MOSFET are both a low-threshold-voltage type MOSFET.

Another aspect of a delay circuit of the present invention is that said first p-channel MOSFET and said second p-channel MOSFET are both a low-threshold-voltage type MOSFET.

By adopting the configuration that is described in detail above, a ring oscillator or a delay circuit according to the present invention achieves a number of effects.

One effect is that it is possible to improve the performance of the semiconductor device in the region of the lower operating voltage of the semiconductor device, that is, in the region of VCCMIN.

Another effect that the present invention achieves is that the current consumption performance in the standby condition is not caused to worsen.

The reason for this is that, by using a circuit that combines MOSFETs having a relatively high threshold voltage with MOSFETs having a relatively low threshold voltage, it is possible to reduce the current consumption.

Additionally, by limiting the use of MOSFETs having a relatively low threshold voltage to the parts of the circuit that have a large influence on the semiconductor device characteristics in a circuit such as an oscillator or a delay circuit, the other parts of the circuit of the semiconductor device are almost all implemented using MOSFETs that have a relatively high threshold voltage, the result being that current consumption of the overall semiconductor device in the standby condition is made small.

What is claimed is:

1. A ring oscillator made up of a plurality of inverters, each being implemented by a first p-channel MOSFET and a first n-channel MOSFET, which are connected to each other forming a ring like configuration, in each one of said inverters, a second p-channel MOSFET which serving as a constant current load of said first p-channel MOSFET is provided between a voltage source and a source of said first p-channel MOSFET, while a second n-channel MOSFET which serving as a constant current load of said first n-channel MOSFET is provided between a source of said first n-channel MOSFET and ground, wherein said first n-channel MOSFET is a low-threshold-voltage type MOSFET, and a level of a threshold voltage of said first n-channel MOSFET is set at a level lower than that of said second n-channel MOSFET.

2. A ring oscillator made up of a plurality of inverters, each being implemented by a first p-channel MOSFET and a first n-channel MOSFET, which are connected to each other forming a ring like configuration, in each one of said inverters, a second p-channel MOSFET which serving as a constant current load of said first p-channel MOSFET is provided between a voltage source and a source of said first p-channel MOSFET, while a second n-channel MOSFET which serving as a constant current load of said first n-channel MOSFET is provided between a source of said first n-channel MOSFET and ground, wherein said first p-channel MOSFET is a low-threshold-voltage type MOSFET, and a level of a threshold voltage of said first p-channel MOSFET is set at a level lower than that of said second p-channel MOSFET.

3. A ring oscillator made up of a plurality of inverters, each being implemented by a first p-channel MOSFET and a first n-channel MOSFET, which are connected to each other forming a ring like configuration, in each one of said inverters, a second p-channel MOSFET which serving as a constant current load of said first p-channel MOSFET is provided between a voltage source and a source of said first p-channel MOSFET, while a second n-channel MOSFET which serving as a constant current load of said first n-channel MOSFET is provided between a source of said first n-channel MOSFET and ground, wherein said first n-channel MOSFET and said second n-channel MOSFET are both low-threshold-voltage type MOSFET, and a level of a threshold voltage of said second n-channel MOSFET is set at approximately the same level as that of said first n-channel MOSFET.

4. A ring oscillator made up of a plurality of inverters, each being implemented by a first p-channel MOSFET and a first n-channel MOSFET, which are connected to each other forming a ring like configuration, in each one of said inverters, a second p-channel MOSFET which serving as a constant current load of said first p-channel MOSFET is provided between a voltage source and a source of said first p-channel MOSFET, while a second n-channel MOSFET which serving as a constant current load of said first n-channel MOSFET is provided between a source of said first n-channel MOSFET and ground, wherein said first p-channel MOSFET and said second p-channel MOSFET are both low-threshold-voltage type MOSFET, and a level of a threshold voltage of said second p-channel MOSFET is set at approximately the same level as that of said first p-channel MOSFET.

5. A ring oscillator made up of a plurality of inverters, each being implemented by a first p-channel MOSFET, a second p-channel MOSFET, a second n-channel MOSFET and a first n-channel MOSFET, each being serially connected to each other in this order from a higher voltage source to a lower voltage source, said second p-channel MOSFET and said second n-channel MOSFET being driven with a constant current so as to serve as a constant current load of said first p-channel MOSFET and said first n-channel MOSFET, respectively, a gate of said first p-channel MOSFET and a gate of said first n-channel MOSFET being connected to each other to form said inverter, said inverters being connected to each other forming a ring like configuration, wherein said first n-channel MOSFET is a low-threshold-voltage type MOSFET, and a level of a threshold voltage of said first n-channel MOSFET is set at a level lower than that of said second n-channel MOSFET.

6. A ring oscillator made up of a plurality of inverters, each being implemented by a first p-channel MOSFET, a second p-channel MOSFET, a second n-channel MOSFET and a first n-channel MOSFET, each being serially connected to each other in this order from a higher voltage source to a lower voltage source, said second p-channel MOSFET and said second n-channel MOSFET being driven with a constant current so as to serve as a constant current load of said first p-channel MOSFET and said first n-channel MOSFET, respectively, a gate of said first p-channel MOSFET and a gate of said first n-channel MOSFET being connected to each other to form said inverter, said inverters being connected to each other forming a ring like configuration, wherein said first p-channel MOSFET is a low-threshold-voltage type MOSFET, and a level of a threshold voltage of said first p-channel MOSFET is set at a level lower than that of said second p-channel MOSFET.

7. A delay circuit made up of a plurality of inverters, each being implemented by a first p-channel MOSFET and a first n-channel MOSFET, which are serially connected to each other, in each one of said inverters, a second p-channel MOSFET which serving as a constant current load of said first p-channel MOSFET is provided between an voltage source and a source of said first p-channel MOSFET, while a second n-channel MOSFET which serving as a constant current load of said first n-channel MOSFET is provided between a source of said first n-channel MOSFET and ground, wherein said first n-channel MOSFET is a low-threshold-voltage type MOSFET, and a level of a threshold voltage of said first n-channel MOSFET is set at a level lower than that of said second n-channel MOSFET.

8. A delay circuit made up of a plurality of inverters, each being implemented by a first p-channel MOSFET and a first n-channel MOSFET, which are serially connected to each other, in each one of said inverters, a second p-channel MOSFET which serving as a constant current load of said first p-channel MOSFET is provided between an voltage source and a source of said first p-channel MOSFET, while a second n-channel MOSFET which serving as a constant current load of said first n-channel MOSFET is provided between a source of said first n-channel MOSFET and ground, wherein said first p-channel MOSFET is a low-threshold-voltage type MOSFET, and a level of a threshold voltage of said first p-channel MOSFET is set at a level lower than that of said second p-channel MOSFET.

9. A delay circuit made up of a plurality of inverters, each being implemented by a first p-channel MOSFET and a first n-channel MOSFET, which are serially connected to each other, in each one of said inverters, a second p-channel MOSFET which serving as a constant current load of said first p-channel MOSFET is provided between an voltage source and a source of said first p-channel MOSFET, while a second n-channel MOSFET which serving as a constant current load of said first n-channel MOSFET is provided between a source of said first n-channel MOSFET and ground, wherein said first n-channel MOSFET and said second n-channel MOSFET are both low-threshold-voltage type MOSFET, and a level of a threshold voltage of said second n-channel MOSFET is set at approximately the same level as that of said first n-channel MOSFET.

10. A delay circuit made up of a plurality of inverters, each being implemented by a first p-channel MOSFET and a first n-channel MOSFET, which are serially connected to each other, in each one of said inverters, a second p-channel MOSFET which serving as a constant current load of said first p-channel MOSFET is provided between an voltage source and a source of said first p-channel MOSFET, while a second n-channel MOSFET which serving as a constant current load of said first n-channel MOSFET is provided between a source of said first n-channel MOSFET and ground, wherein said first p-channel MOSFET and said second p-channel MOSFET are both low-threshold-voltage type MOSFET, and a level of a threshold voltage of said second p-channel MOSFET is set at approximately the same level as that of said first p-channel MOSFET.

11. A delay circuit made up of a plurality of inverters, each being implemented by a first p-channel MOSFET, a second p-channel MOSFET, a second n-channel MOSFET and a first n-channel MOSFET, each being serially connected to each other in this order from a higher voltage source to a lower voltage source, said second p-channel MOSFET and said second n-channel MOSFET being driven with a constant current so as to serve as a constant current load of said first p-channel MOSFET and said first n-channel MOSFET, respectively, a gate of said first p-channel MOSFET and a gate of said first n-channel MOSFET being connected to each other to form said inverter, said inverters being serially connected to each other, wherein said first n-channel MOSFET is a low-threshold-voltage type MOSFET, and a level of a threshold voltage of said first n-channel MOSFET is set at a level lower than that of said second n-channel MOSFET.

12. A delay circuit made up of a plurality of inverters, each being implemented by a first p-channel MOSFET, a second p-channel MOSFET, a second n-channel MOSFET and a first n-channel MOSFET, each being serially connected to each other in this order from a higher voltage source to a lower voltage source, said second p-channel MOSFET and said second n-channel MOSFET being driven with a constant current so as to serve as a constant current load of said first p-channel MOSFET and said first n-channel MOSFET, respectively, a gate of said first p-channel MOSFET and a gate of said first n-channel MOSFET being connected to each other to form said inverter, said inverters being serially connected to each other, wherein said first p-channel MOSFET is a low-threshold-voltage type MOSFET, and a level of a threshold voltage of said first p-channel MOSFET is set at a level lower than that of said second p-channel MOSFET.

* * * * *